United States Patent
Koehler et al.

(10) Patent No.: US 11,334,047 B2
(45) Date of Patent: May 17, 2022

(54) DEVICE AND METHOD FOR THE CONTROLLED PROCESSING OF A WORKPIECE WITH PROCESSING RADIATION

(71) Applicant: Carl Zeiss Jena GmbH, Jena (DE)

(72) Inventors: Thomas Koehler, Jena (DE); Christian Schindler, Weimar (DE); Hannes Scheibe, Magdala (DE); Eckhard Roth, Grossloebichau (DE)

(73) Assignee: CARL ZEISS JENA GMBH, Jena (DE)

( * ) Notice: Subject to any disclaimer, the term of this patent is extended or adjusted under 35 U.S.C. 154(b) by 370 days.

(21) Appl. No.: 16/721,271

(22) Filed: Dec. 19, 2019

(65) Prior Publication Data
US 2020/0201281 A1 Jun. 25, 2020

(30) Foreign Application Priority Data
Dec. 20, 2018 (DE) ...................... 10 2018 133 083.9

(51) Int. Cl.
*G05B 19/402* (2006.01)
*H01J 37/30* (2006.01)
*H01J 37/302* (2006.01)

(52) U.S. Cl.
CPC ............ *G05B 19/402* (2013.01); *H01J 37/30* (2013.01); *H01J 37/302* (2013.01); *G05B 2219/49031* (2013.01)

(58) Field of Classification Search
CPC ...... B23K 10/00; B23K 10/027; B23K 26/04; B23K 26/0624; B23K 26/0823;
(Continued)

(56) References Cited

U.S. PATENT DOCUMENTS

2007/0024998 A1* 2/2007 Bills ..................... G06T 7/0004
359/850
2007/0246664 A1 10/2007 Yamazaki et al.
(Continued)

FOREIGN PATENT DOCUMENTS

DE 102017208953 A1 11/2017
EP 2202026 A1 6/2010

*Primary Examiner* — Kidest Bahta
(74) *Attorney, Agent, or Firm* — Patentbar International PC

(57) ABSTRACT

A device and method for the controlled processing of at least one workpiece (1), comprising a workpiece carrier (2) on which at least one workpiece receptacle (2.1) is present remote from a rotary shaft (2.0), at least one processing unit (3) and at least one inspection unit (4), which are offset relative to the rotary shaft (2.0) by an angular distance ($\beta_n$) from one another, are each arranged so that they can be adjusted and moved in a translational manner radially with respect to the rotary shaft (2.0), so that a processing beam (E) and an inspection beam (P), offset relative to one another by the angular distance ($\beta_n$), describe the same spiral-shaped movement path (S) relative to the workpiece carrier (2), and the inspection results derived at an inspection point ($P_P$) are used to control process parameters in order to change the effect of the processing beam (E).

13 Claims, 2 Drawing Sheets

(58) Field of Classification Search
CPC .. B23K 26/0869; B23K 26/362; B23K 26/38; B23K 26/53; G05B 19/402; G05B 2219/49031; H01J 37/30; H01J 37/302
See application file for complete search history.

(56) References Cited

U.S. PATENT DOCUMENTS

| | | |
|---|---|---|
| 2008/0204748 A1 | 8/2008 | Nomaru et al. |
| 2011/0037824 A1 | 2/2011 | Usami |
| 2013/0258321 A1* | 10/2013 | Jurca ..................... G01N 21/94 356/73 |
| 2017/0113322 A1* | 4/2017 | Akita ................. B24B 27/0608 |

* cited by examiner

DEVICE AND METHOD FOR THE CONTROLLED PROCESSING OF A WORKPIECE WITH PROCESSING RADIATION

RELATED APPLICATIONS

This application claims priority to German Patent Application DE 10 2018 133 083.9, filed Dec. 20, 2018, which is incorporated herein by reference in its entirety.

FIELD OF THE INVENTION

The invention relates to a device and a method for processing a workpiece by means of processing radiation, as generically known from EP 2 202 026 A1.

BACKGROUND OF THE INVENTION

In addition to mechanical processes, it is known that by means of processing radiation, i.e. one or more identical or different processing beams, material can be separated, removed or modified in order to process the contour or surface of a workpiece. The disadvantage of processing by means of processing radiation is that the processing result is comparatively undefined compared to mechanical processing. On the one hand, this is caused by parameter fluctuations of the energy input, which can be caused by, for example, fluctuations in the focal position and power fluctuations of the processing beam, but also by material inhomogeneities of the workpiece. There is a multitude of prior art technical solutions in which the parameters determining the energy input are monitored and readjusted in order to minimise their fluctuation range. For example, it is known that the focus position can be monitored and readjusted or that the intensity fluctuation of the processing beam can be recorded via a decoupled reference beam in order to readjust the power output of the radiation source. Such solutions, however, completely disregard the influence of the workpiece itself on the processing result.

The above-mentioned EP 2 202 026 A1 describes a laser processing device and a method for manufacturing thin-film solar cells in which material is removed from a workpiece, in this case a film layer from a substrate, along parallel lines, forming grooves. It was recognized as a problem that the quality of the grooves is impaired, for example, by fluctuations of the laser intensity, by fluctuations of the film thickness and by the waviness of the substrate.

In contrast to other prior art solutions mentioned in EP 2 202 026 A1, wherein the workpiece is transported to a measuring station after processing and then, if reworking is necessary, back to the processing station where it blocks the processing of the next workpiece, resulting in a reduction in throughput, the workpiece is simultaneously processed and measured here.

Specifically, a device is proposed comprising a processing laser beam means, an optical inspection means and a waviness measuring means, wherein the aforementioned means have a fixed spatial arrangement with respect to one another and can be moved in the y-direction relative to a Cartesian coordinate system to a workpiece table and can be adjusted in the x-direction stepwise by the distance of the grooves to be produced which extend in the y-direction.

In each case after the workpiece table has been moved once along the y-direction in one sense, the workpiece being irradiated with a laser beam coming from the processing laser beam means and a groove being formed, the workpiece table, before the laser beam is again moved along the y-direction in the opposite sense, is displaced by the predetermined distance in the x-direction, so that linear, parallel grooves are formed by the laser beam at regular distances from one another. The optical axis of the objective of the optical inspection means is arranged downstream of the optical axis of the processing laser beam means by the specified distance or a multiple thereof in the x-direction, so that a groove already produced is inspected simultaneously with the production of a groove, in particular detecting the depth, width or roughness of the groove. The waviness measuring means comprises an auxiliary light source and an auxiliary photodetector. The measuring beam emitted by the auxiliary light source is directed at a point which is arranged upstream of the groove being produced, in the x-direction by the specified distance or a multiple thereof, so that the waviness of the surface of the workpiece is detected simultaneously with the production and inspection of the groove. Since the workpiece is moved by the same movement of the workpiece table relative to the points of incidence of the processing laser beam, the measuring beam of the waviness measuring means and the inspection beam of the inspection means, the points of incidence have a fixed spatial position relative to each other and can be assigned to each other as correlated points of incidence. Compared to systems in which a workpiece is measured and inspected at a different location than the processing location, the overall process time is shorter and the accuracy of the inspection is higher. In addition, when errors are detected during inspection, the groove in question can only be repositioned under the processing laser beam by a defined repositioning in order to be post-treated. Moreover, the result of the waviness measurement can be used to control processing parameters, e.g. to change the focus position of the processing laser beam by adjusting the condenser lens of the processing laser beam means.

A particular disadvantage of a method according to the aforementioned EP 2 202 026 A1 is that the continuous stepwise adjustment of the workpiece in one sense in the x-direction must be interrupted and the workpiece must be moved back in the opposite sense in order to feed an inspected groove to a reworking operation if required.

It is also disadvantageous that the relative speed between the processing laser beam and the workpiece is not constant until the end of a groove due to the reversal of movement, at the respective reversal points, if the reversal points are not placed outside the workpiece.

SUMMARY OF THE INVENTION

It is the object of the invention to provide a device and a method in which several workpieces can be processed simultaneously with a high degree of accuracy and a high degree of temporal efficiency.

For a device comprising a workpiece carrier which has at least one workpiece receptacle for receiving at least one workpiece, at least one processing unit having a processing beam source which directs a processing beam onto the workpiece received in the at least one workpiece receptacle, at least one inspection unit having an inspection beam source which directs an inspection beam onto the workpiece received in the at least one workpiece receptacle, and a detector which detects a transmitted, reflected or scattered inspection beam portion of the inspection beam, and at least one linear motor, by which the at least one processing unit and the at least one inspection unit can be moved relative to the workpiece carrier, wherein the workpiece positioned in the at least one workpiece receptacle is scanned by the processing beam and the inspection beam following the processing beam, along scanning lines extending side by side, and the workpiece is processed and inspected along the scanning lines, the object is achieved by the following features:

A motor is present and the workpiece carrier has a revolving rotary shaft which is connected to the motor in order to generate a rotary motion of the workpiece carrier in a direction of rotation ($R_{rot}$).

The at least one processing unit and the at least one inspection unit, offset by an angular distance relative to one another, are arranged so as to be radially adjustable relative to the rotary shaft and are connected to the at least one linear motor in order to generate translational movements of the processing unit and of the inspection unit relative to the workpiece carrier in two radial translational directions which enclose the angular distance with one another. Thereby, when the motor and the at least one linear motor are controlled simultaneously, the processing beam and the inspection beam, offset from one another by the angular distance, describe the same spiral movement path with a plurality of turnings relative to the workpiece carrier.

The at least one workpiece receptacle is arranged at a distance from the rotary shaft so that the at least one workpiece receptacle or a workpiece positioned therein is covered by partial sections of the turnings which each represent one of the scan lines.

A control and computing unit is present, which is connected to the at least one inspection unit, to the at least one processing unit, to the motor and to the at least one linear motor in order to change at least one process parameter of the device as a function of inspection results derived from the detected inspection beam portion.

Advantageously, there is a sum of several processing units which are arranged to form a circle around the rotary shaft, said sum being greater than the number of workpiece receptacles.

It is also advantageous if at least one first tilting unit is present which is connected to the at least one processing unit, and at least one second tilting unit is present which is connected to the at least one inspection unit, thus allowing the orientation of the processing beam and of the inspection beam to be changed with respect to a surface of the workpiece positioned in the at least one workpiece receptacle.

The processing beam source of the at least one processing unit is advantageously a laser or a plasma beam source.

For a method wherein at least one workpiece is positioned in a workpiece receptacle on a workpiece carrier and is scanned several times in each case in one scanning cycle by a processing beam along scan lines extending side by side, while the workpiece is being processed, and is scanned during the scanning cycles by an inspection beam following the processing beam, with measurements being carried out in which location-related inspection results are derived from transmitted, reflected or scattered inspection beam portions of the inspection beam impinging on one of the workpieces at extended inspection points in each case, from which inspection results conclusions are drawn as to the effect of the local action of the processing beam on the respective workpiece, the object is achieved by the following features:

The workpiece performs a rotary motion in a direction of rotation at a rotational speed around a rotary shaft located outside the workpiece.

At the same time, the processing beam and the inspection beam perform translational movements radially to the rotary shaft at the same feed rate in two translational directions enclosing an angular distance with one another.

Thereby, the processing beam and the inspection beam each describe, by the superposition of the rotary motion with one of the translational movements over a plurality of revolutions of the workpiece carrier, a respective identical spiral-shaped movement path with a plurality of turnings about the rotary shaft relative to the workpiece carrier, wherein in each case a partial section of one of the turnings covering the workpiece receptacle forms one of the scan lines.

The inspection results are respectively supplied, as actual values which are location-related to one of the inspection points, to a control and computing unit where they are assigned to stored target values which are location-related to the workpiece and are compared with these.

In the event of a deviation of one of the target values from the assigned actual value, at least one process parameter is changed if the processing beam subsequently impinges on the workpiece at a point of incidence within the relevant inspection point at which the location-related actual values on which the change is based were previously obtained.

Advantageously, the inspection points each have a larger extension than the points of incidence and the change in process parameters occurs within the same scanning cycle.

Alternatively, the change in process parameters advantageously occurs within a subsequent scanning cycle.

It is also favorable for the rotational speed to be controlled as a function of the radial distance of a point of incidence of the processing beam in order to achieve a constant exposure time of the processing beam along the scan lines.

The pitch of the spiral movement path and thus the distance between the scan lines is preferably set by setting the ratio between the rotational speed and the feed rate.

Also advantageously, the direction of rotation is reversed during the process.

It is favorable for the workpiece to be processed by more than one processing beam during one revolution of the workpiece carrier and/or for the workpiece to be inspected by more than one inspection beam during one revolution of the workpiece carrier.

Also, several workpieces can be advantageously processed and inspected in the same scanning cycles by positioning them on the workpiece carrier for the same processing period.

BRIEF DESCRIPTION OF THE DRAWINGS

The invention will be explained in more detail below with reference to exemplary embodiments and with the help of drawings, wherein.

DETAILED DESCRIPTION OF THE PREFERRED EMBODIMENTS

Figure 1A:
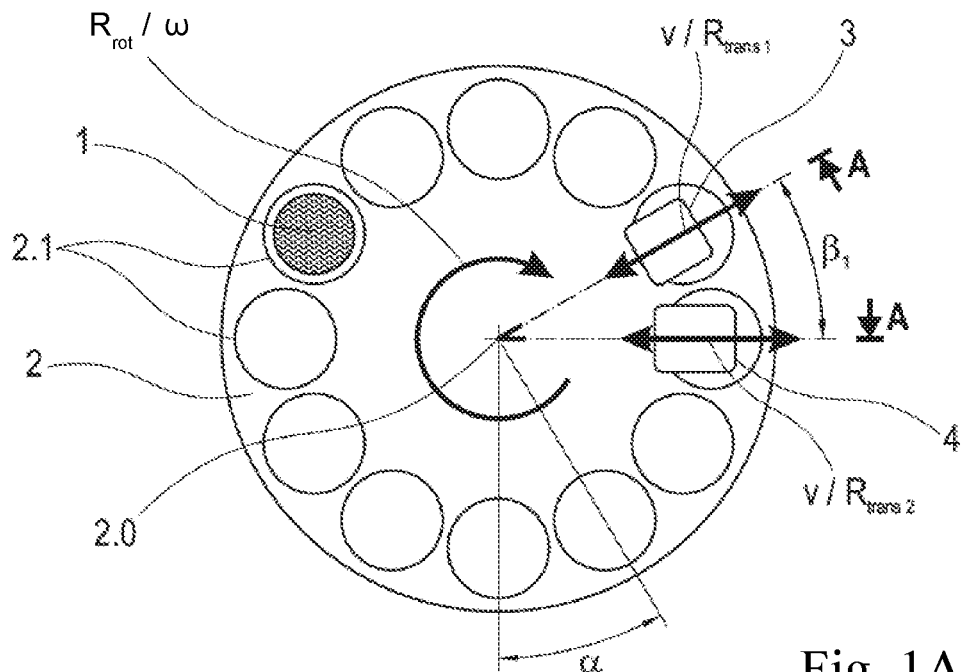
FIG. 1A shows a schematic diagram of an embodiment of a device comprising only one processing unit and one inspection unit in a top view.
Figure 1B:
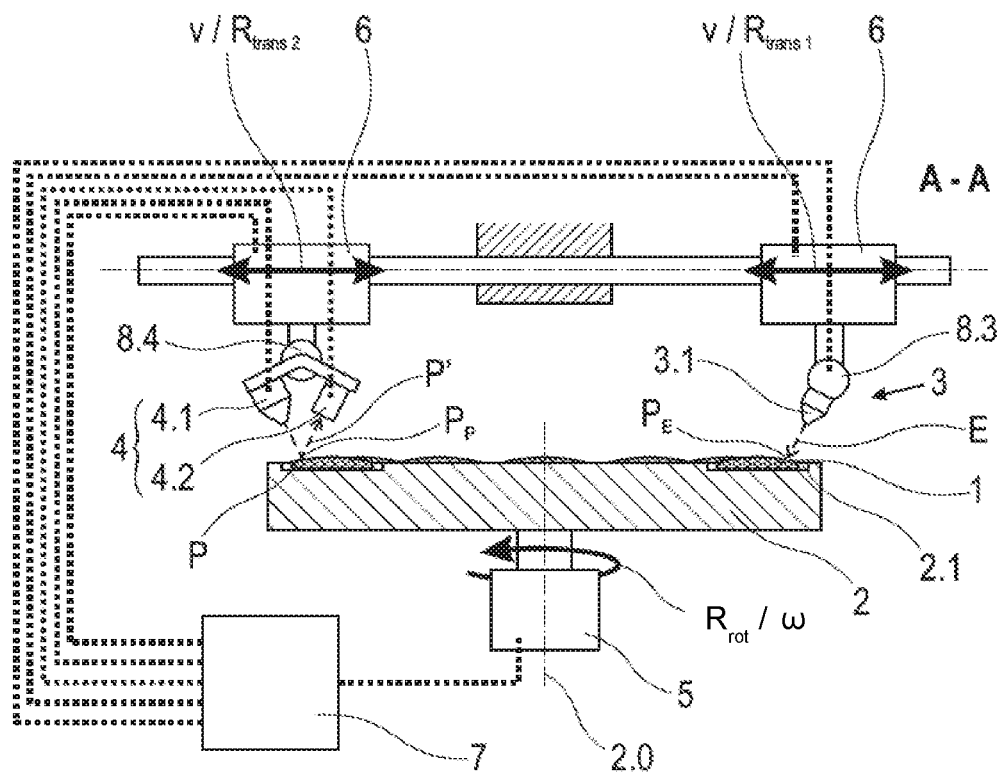
FIG. 1B shows a lateral view of the embodiment according to FIG. 1a as a schematic diagram.

A device according to the invention substantially comprises, as shown in FIGS. 1A and 1B, a workpiece carrier 2, at least one processing unit 3, at least one inspection unit 4, a motor 5, at least one linear motor 6 and a control and computing unit 7.

The workpiece carrier 2 has a revolving rotary shaft 2.0 which is connected to the motor 5 and can be rotated in a direction of rotation $R_{rot}$, which can also be reversed during the process, with an adjustable rotational speed to. The workpiece carrier 2 is preferably designed in the form of a rotary plate or a rotary disc with two end faces. It has at least one workpiece receptacle 2.1 on one of the end faces, in each of which a workpiece 1 is positioned in a defined spatial position relative to a coordinate system defined by the workpiece carrier 2. This allows each point on the surface of one of the workpieces 1 to be assigned a location in space related to the workpiece carrier 2 and vice versa. Preferably, several workpiece receptacles 2.1 are arranged on one or both of the end faces on the workpiece carrier 2, which preferably all have the same distance a and the same orientation relative to the rotary shaft 2.0, so that workpieces 1 positioned therein have the same spatial position relative to the workpiece carrier 2, merely offset from one another by an angle of rotation α. The minimum possible angle of rotation α between the respective adjacent workpiece receptacles 2.1 is determined by the size of the workpieces 1 and thus the workpiece receptacles 2.1.

Depending on the number of workpiece receptacles 2.1, several workpieces 1 can be positioned simultaneously on the workpiece carrier 2, which are then processed together in several scanning cycles. Processing is to be understood as any change to the workpiece 1 possible with a processing beam, such as removal, cutting or modification.

In principle, by means of a differentiated control of the at least one processing unit 3, which will be explained below, different workpieces 1 or identical workpieces 1 can also be processed using a different processing regime within the scanning cycles by controlling the processing unit 3 in a differentiated manner, which will, however, be disregarded in the following explanations for the sake of simplicity. Several processing units 3 can simultaneously process workpieces 1, which are arranged on one of the end faces or also on both end faces in the workpiece receptacles 2.1. There may also be several inspection units 4 directed either at one end face or at both end faces.

In addition, for simplicity's sake, the following description will be based on only one processing unit 3 and only one inspection unit 4. It can easily be transferred to a device comprising several processing units 3 and/or several inspection units 4.

The processing unit 3 has a processing beam source 3.1 which emits a processing beam E and directs it directly or via a beam emitting unit with beam-shaping optics onto the workpiece receptacle 2.1 or onto the workpiece 1 positioned therein. Processing beam sources 3.1 used include, for example, lasers, in particular ultra-short pulse lasers, and plasma beam sources. In addition to the generally applicable advantages of a laser, in particular a short-pulse laser, namely that, without contact and as a wear-free tool, it influences only a narrowly limited effective zone and thermally influences adjacent material only slightly at the most, the advantages that come into effect in conjunction with a device of the invention, in particular, are that an energy input by the laser into the material can be controlled via orders of magnitude and by changing various process parameters. In addition to the generally applicable advantages resulting from the use of plasma radiation as a tool, which also lie in the contactless processing of a workpiece and thus in the tool's absence of wear, it is an advantage that the tool width can be easily controlled. In both cases, the effect of the tool can be specifically controlled via the control of process parameters, which is why the temporary actual processing state must be repeatedly adapted to the temporary nominal processing state via a repeated interim inspection of the processing result during processing of a workpiece and a resulting change in control variables. In both cases any material removed evaporates, which is why a local inspection using an optical inspection unit is possible immediately after processing.

The inspection unit 4 comprises an inspection beam source 4.1, which emits an inspection beam P and directs it directly or via a beam emitting unit, with beam-shaping optics, onto the workpiece carrier 2, and a detector 4.2, which detects an inspection beam portion P' transmitted, reflected or scattered on the workpiece 1.

The processing unit 3 and the inspection unit 4 are synchronously linearly movable relative to the workpiece carrier 2, together and synchronized with each other, by means of a linear motor 6, or one respective linear motor 6 each, so that the processing unit 3 and the inspection unit 4 scan the same workpiece 1 in the same way along adjacent scan lines with a time offset determined by the local offset between the processing unit 3 and the inspection unit 4 by an angular distance $β_n$ and the rotational speed ω of the workpiece carrier 2, while the workpiece 1 is being processed and inspected along the scan lines. For the purposes of this description, a linear motor 6 is defined as any drive that enables a translational motion in a constant direction with a changing sense.

In addition, a supplementary detector 4.2, e.g. a spectrometer, may be present which detects emitting radiation at the processing location.

It is essential to the invention that the processing unit 3 and the inspection unit 4, strictly speaking their central axes, enclosing an angular distance βn determined by the offset, are each arranged adjustable radially to the rotary shaft 2.0 and driven in two radial translational directions Rtrans 1, Rtrans 2 to perform translational motions with alternating senses of direction.

When the motor 5 and the at least one linear motor 6 are controlled simultaneously, the processing beam E and the inspection beam P describe the same spiral movement path S around the rotary shaft 2.0 of the workpiece carrier 2, but are directed at different locations on the movement path S at the same time. This means that a location where the processing beam E impinges is exposed to the inspection beam P after a known period of time. Thus, the processing beam E impinges at a point of incidence $P_E$ and the inspection beam P impinges at an inspection point $P_P$. The point of incidence $P_E$ and the inspection point $P_P$ each have a planar extension, which is determined by the respective cross-section of the processing beam E or the inspection beam P as they impinge on the surface of the workpiece 1. The spiral-shaped movement path S preferably represents an Archimedean spiral, in which adjacent turnings W, which each represent a 360° circumferential section of the spiral, have a constant distance from each other. For this purpose, the rotational speed ω is preferably adapted, according to the increasing distance of the points of incidence $P_E$ from the rotary shaft 2.0, to the increasing length of the turnings W. Advantageously, the spiral movement path S can have an oscillation superimposed on it, which—just like the reversal of the direction of rotation $R_{rot}$—serves to avoid the formation of directed surface structures.

It is further essential to the invention that the workpiece receptacle 2.1 is located at a distance a from the rotary shaft

2.0. As shown schematically in FIG. 1C, this means that at least one workpiece receptacle 2.1 or a workpiece 1 positioned therein is only covered by partial sections S' of the turnings W of the movement path S, which each represent one of the scan lines.

The control and computing unit 7 is connected to the at least one inspection unit 4, to the at least one processing unit 3, to the motor 5 and to the at least one linear motor 6 and can thus change at least one process parameter of the device and switch the processing beam E and the inspection beam P on and off as a function of inspection results derived from the detected inspection beam portion P'.

Figure 2:
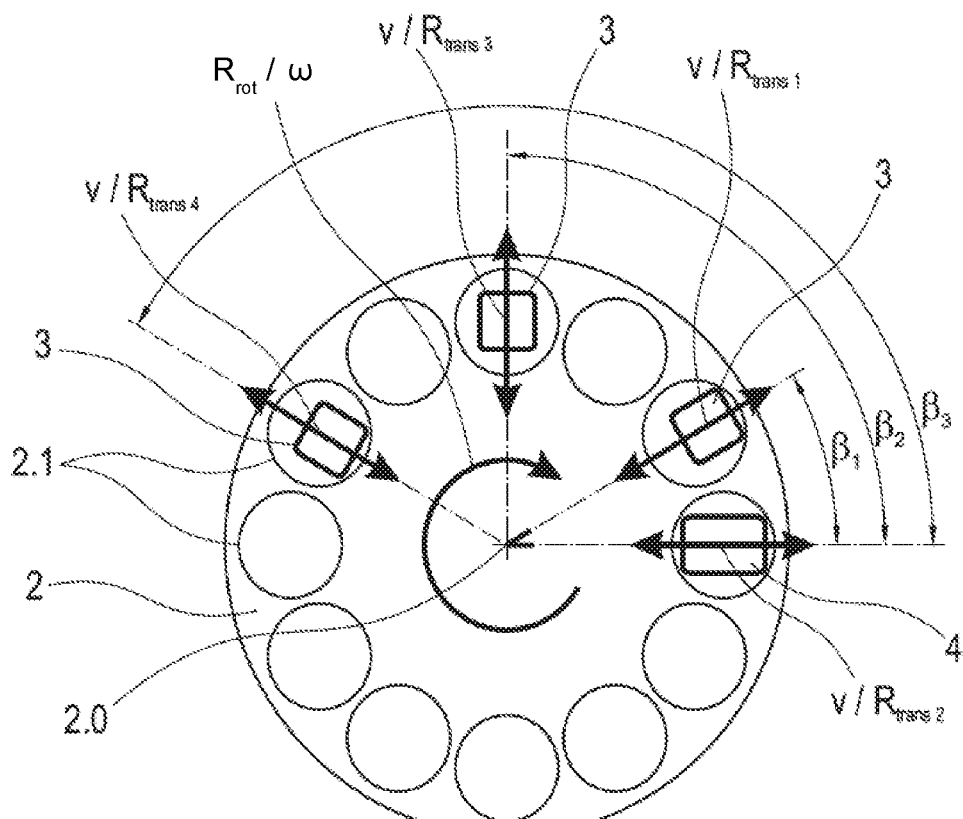
FIG. 2 shows a schematic diagram of an embodiment of a device comprising three processing units and one inspection unit in a top view.

Advantageously, there are as many workpiece receptacles 2.1 on the workpiece carrier 2 as there is space for them in order to be able to process as many workpieces 1 as possible within one processing cycle. If the workpieces 1 are to be processed within the processing cycle using processing beams E from different processing beam sources 3.1, e.g. first with an ultra-short pulse laser beam and then with a plasma beam, two processing units 3 will be arranged accordingly. However, several processing units of the same type can also be arranged advantageously, which shortens the cycle time. FIG. 2 shows an example of a device comprising one inspection unit 4 and three processing units 3, each enclosing a known angular distance $\beta_n$ with the inspection unit 4. The angular distances $\beta_n$ are preferably adjustable, whereby the time interval between the processing by two processing beams E can be influenced, e.g. to avoid or promote intermediate cooling. Several inspection units 4 allow more precise control of the process parameters.

Just as a number of workpiece receptacles 2.1 on the workpiece carrier 2 that is limited by the size of the workpieces 1 can be used to the full, the number of processing units 3 for a device which is limited by the space required by the processing units 3 can also be used to the full.

Since the processing or inspection of a workpiece 1 occurs independently of each other exactly when one of the workpieces 1 is rotated under the processing beam E or the inspection beam P, the device can generally be equipped with a maximum number of workpiece receptacles 2.1, processing units 3 and inspection units 4 limited by the space required. Since the rotary motion for all processing and inspection units 3, 4 is carried out by the same workpiece carrier 2, this only requires synchronous translational motion of the processing and inspection units 3, 4.

In order to be able to process and inspect workpieces 1 with a three-dimensional surface, there is one tilting unit 8.3, 8.4 per processing unit 3 and per inspection unit 4, also connected to the control and computing unit 7, which preferably has two tilting axes arranged perpendicular to each other. This allows the processing and inspection units 3, 4, respectively, to be tilted in their spatial position relative to the workpiece carrier 2 and aligned so that they impinge on the surfaces of the workpieces 1 at a specified impingement angle. In this case, at least the processing beam E is directed perpendicular to the surface. As for the inspection beam P, it must always be directed at the same solid angle position to the surface perpendicular in order to have the same measuring conditions.

In the following, a method according to the invention will be described in its generally applicable form and in advantageous embodiments.

Similar to a method known from the prior art, at least one workpiece 1 is positioned in a workpiece receptacle 2.1 on a workpiece carrier 2 and scanned by a processing beam E along adjacent scan lines, while being processed, and is scanned by an inspection beam P, while measurements are carried out by deriving inspection results, which are location-related to the surface of the workpiece 1, from an inspection beam portion P' of the inspection beam P transmitted, reflected or scattered on the workpiece 1, from which inspection results conclusions are drawn about the effect of the action of the processing beam E on the workpiece 1.

It is essential to the invention that the workpiece 1 performs a rotary motion at a rotational speed ω around a rotary shaft 2.0 of the workpiece carrier 2 located outside the workpiece 1 and at the same time the processing beam E and the inspection beam P each carry out a rotary motion at a feed rate v in two translational directions $R_{trans\ 1}$, $R_{trans\ 2}$, radially to the rotary shaft 2.0, enclosing an angular distance $\beta_n$ with each other. By superimposing the rotary motion with one of the translational motions, the processing beam E and the inspection beam P each describe the same spiral movement path S with a plurality of turnings W relative to the workpiece carrier 2. The scan lines are formed by partial sections S' of the turnings W, each covering the workpiece receptacle 2.1 in which one of the workpieces 1 is positioned. Depending on the distance of the scan lines, which is set via the ratio of the rotational speed ω to the feed rate v, and on the parameters of the processing beam E, which determine the width of the resulting processing track along the scan lines, overlapping, adjacent or spaced-apart processing tracks are generated. The processing tracks themselves are formed by adjacent or usually overlapping points of incidence of the processing beam E, which usually have the same or a smaller cross-section than the inspection points $P_P$, which are determined by the cross-section of the impinging inspection beam P. Several points of incidence $P_E$ of the processing beam E along a scan line or an adjacent scan line can then be assigned to the inspection points $P_P$ which are location-related to the workpiece carrier 2 and thus to the workpieces 1.

The inspection results of one measurement each, which are obtained from an inspection beam portion P' transmitted, reflected or scattered at an inspection point PP, are fed to a control and computing unit 7 as location-related actual values. There they are assigned to stored location-related target values and compared with these. In the event of a deviation of one of the target values from the assigned actual value, at least one process parameter is changed if the processing beam E subsequently impinges on the workpiece 1 in a point of incidence PE within the relevant inspection point PP at which the location-related actual values on which the change is based were previously obtained. Changing process parameters as a function of temporary processing results during processing leads to a controlled processing process.

A variable process parameter is, for example, the exposure time of the processing beam E at a point of incidence $P_E$. It can be influenced by controlling the rotational speed ω. Regardless of this, the rotational speed ω must be controlled as a function of the radial distance r of a point of incidence $P_E$ of the processing beam E in order to achieve a constant exposure time of the processing beam E along the scan lines. Other controllable process parameters are e.g. the radiation power of the respective processing beam source, the pulse frequency and pulse density of the processing beam 3.1, the cross-sectional size of the point of incidence $P_E$, which can be controlled e.g. via focusing or even more precisely via focus tracking, and the relative speed of the processing beam E relative to the workpiece carrier 2.

The pitch of the spiral movement path S and thus the distance between the scan lines can be set advantageously by setting the ratio between the rotational speed ω and the feed rate v. In particular, this allows the degree of overlap of the resulting processing tracks to be set.

The at least one process parameter is changed when the processing beam E is directed onto the workpiece 1 at a location where the location-related actual values resulting in the change were previously obtained.

This may be done within a subsequent scanning cycle, or if the inspection points $P_P$ each have a larger extension than the points of incidence $P_E$ within the same scanning cycle when scanning a next scan line.

Figure 1C:
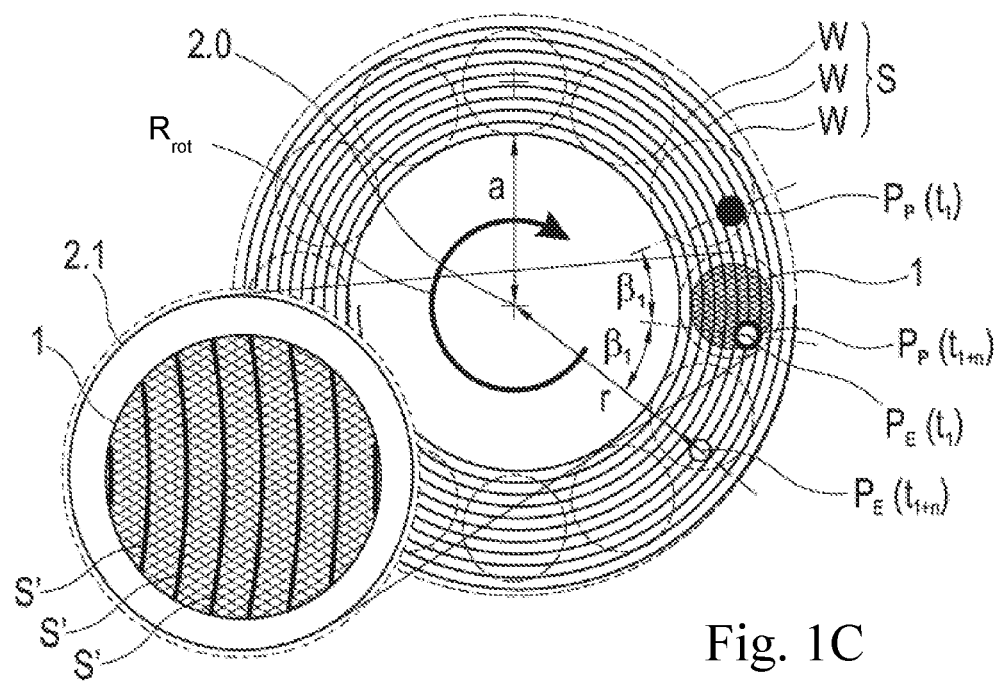
FIG. 1C shows a schematic representation of the movement path relative to a workpiece.

FIG. 1C shows the position of a point of incidence $P_E$ and an inspection point $P_P$ on the movement path S for an exemplary first time $t_1$, after a few revolutions during a scanning cycle. The point of incidence $P_E$ lies on the workpiece 1 shown here and the bold scan lines, which represent partial sections S' of the movement path S, have already been processed in this scanning cycle. The inspection point $P_P$ follows the point of incidence $P_E$ in the direction of rotation $R_{rot}$ at an angular distance $\beta_1$ and is located behind the workpiece 1 at the first time $t_1$.

At a later time $t_{1+n}$ the inspection point $P_P$ is located on the workpiece 1 and the point of incidence $P_E$ is located in front of the workpiece 1. Knowing the relative position and the orientation of the inspection unit 4 to the processing unit 3 and to the workpiece carrier 2 and knowing the spatial position and orientation of the workpiece 1 to the workpiece carrier 2, the measurement results derived from the inspection point $P_P$ at the time $t_1$ in the same scanning cycle or in the subsequent scanning cycle can be assigned to a location on the workpiece 1 in that the processing beam E impinges on at least one point of incidence $P_E$. The deviations derived from the location-related measurement results in comparison with target results can be used to change process parameters precisely when the processing beam E impinges on a location on the workpiece 1 where deviations assigned to this location were derived from an inspection point $P_P$, thus delaying the control of the processing process.

With the device having several processing units 3, it is possible to process, during one revolution, all the workpieces 1 arranged on the workpiece carrier 2 using more than one processing beam E.

Similarly, the workpiece 1 can be inspected using more than one inspection beam P during one revolution of the workpiece carrier 2 if the device has several inspection units 4.

And several workpieces 1 can be processed and inspected in parallel in one cycle by positioning them on the workpiece carrier 2 for the same processing period.

It may be advantageous to reverse the direction of rotation $R_{rot}$ during the process. As a result, slightly different movement paths S will form, counteracting the formation of directed structures on the surface.

The device and the method are particularly advantageous when an ultra-short pulse laser is used as the processing beam source 3.1. As is well known, material removal is carried out by means of such a laser by vaporizing a tiny amount of material per pulse per point of incidence $P_E$, so that the desired total removal is only achieved by multiple scanning of the surface to be processed. This means that each location on the surface of the workpiece 1 to be processed is exposed to the laser beam several times in several scanning cycles. Process parameters are monitored and controlled so that the actual ablation per scanning cycle is always close to the target ablation in this scanning cycle, resulting in a very accurate processing result, which manifests itself in an exact, reproducible surface geometry and/or surface quality.

LIST OF REFERENCE NUMERALS 1 workpiece
2 workpiece carrier
2.0 rotary shaft
2.1 workpiece receptacle
3 processing unit
3.1 processing beam source
4 inspection unit
4.1 inspection beam source
4.2 detector
5 motor
6 linear motor
7 control and computing unit
8.3 tilting unit of the processing unit 3
8.4 tilting unit of the inspection unit 4
E processing beam
P inspection beam
P' inspection beam portion
$R_{rot}$ direction of rotation
$R_{trans\ n}$ translational directions
ω rotational speed
v feed rate
α angle of rotation
$\beta_n$ angular distance
a distance of the workpiece 2 from the rotary shaft 2.0
r radial distance of the point of incidence $P_E$
$P_E$ point of incidence of the processing beam E
$P_P$ inspection point
S movement path
S' partial section of the turnings W of the movement path S
W turnings of the movement path S

What is claimed is:

1. A device for controlled processing of at least one workpiece with processing radiation, the device comprising:
a workpiece carrier having a revolving rotary shaft and at least one workpiece receptacle for receiving the at least one workpiece, at least one processing unit having a processing beam source which directs a processing beam (E) onto the workpiece received in the at least one workpiece receptacle, at least one inspection unit having an inspection beam source which directs an inspection beam (P) onto the workpiece, and a detector which detects a transmitted, reflected or scattered inspection beam portion (P') of the inspection beam (P), and at least one linear motor by which the at least one processing unit and the at least one inspection unit can be moved relative to the workpiece carrier, wherein the workpiece is scanned by the processing beam (E) and the inspection beam (P) following the processing beam (E), along scanning lines extending side by side, and the workpiece is processed and inspected along the scanning lines;
the revolving rotary shaft is connected to a motor to generate rotary motion of the workpiece carrier in a direction of rotation ($R_{rot}$);
the at least one processing unit and the at least one inspection unit being offset by an angular distance ($\beta_n$) relative to one another and each being arranged to be radially adjustable relative to the rotary shaft and being connected to the at least one linear motor to generate translational movements of the processing unit and of the inspection unit relative to the workpiece carrier in two radial translational directions ($R_{trans\ 1}$, $R_{trans\ 2}$) forming the angular distance ($\beta_n$) with one another;

whereby the processing beam (E) and the inspection beam (P) are offset from one another by the angular distance ($\beta_n$) and follow the same spiral movement path (S) with a plurality of turnings (W) relative to the workpiece carrier;

the at least one workpiece receptacle being arranged at a distance (a) from the rotary shaft so that the at least one workpiece receptacle or the at least one workpiece positioned therein is covered by partial sections (S') of the turnings (W) which each represent one of the scanning lines; and a control and computing unit being connected to the at least one inspection unit, to the at least one processing unit, to the motor and to the at least one linear motor to change at least one process parameter of the device as a function of inspection results derived from the inspection beam portion (P)'.

2. The device according to claim 1, wherein several processing units are arranged to form a circle around the rotary shaft and wherein a number of the several processing units is greater than a number of workpiece receptacles.

3. The device according to claim 2, further comprising at least one first tilting unit and at least one second tilting unit, the at least one first tilting unit being connected to the at least one processing unit, and the at least one second tilting unit being connected to the at least one inspection unit, in order to change orientation of the processing beam (E) and of the inspection beam (P) with respect to a surface of the workpiece.

4. The device according to claim 1, wherein the processing beam source of the at least one processing unit is a laser or a plasma beam source.

5. A method for controlled processing of at least one workpiece with processing radiation, the method comprising:

positioning the at least one workpiece in a workpiece receptacle on a workpiece carrier and scanning the at least one workpiece several times in each case in one scanning cycle by a processing beam (E) along scanning lines extending side by side;

scanning the at least one workpiece by an inspection beam (P) following the processing beam (E); carrying out measurements and deriving location-related inspection results from transmitted, reflected or scattered inspection beam portions (P') of the inspection beam (P) impinging on the at least one workpiece at extended inspection points ($P_P$) in each case;

using inspection results to determine the effect of local action of the processing beam (E) on the at least one workpiece; wherein the at least one workpiece executes a rotary motion in a direction of rotation ($R_{rot}$) at a rotational speed ($\omega$) about a rotary shaft of the workpiece carrier lying outside the workpiece, and at the same time the processing beam (E) and the inspection beam (P) perform translational movements radially to the rotary shaft at a feed rate (v) in two translational directions ($R_{trans\ 1}$, $R_{trans\ 2}$) enclosing an angular distance ($\beta_n$) with one another, so that the processing beam (E) and the inspection beam (P) each describe, by the superposition of the rotary motion with one of the translational movements over a plurality of revolutions of the workpiece carrier, a respective identical spiral-shaped movement path (S) with a plurality of turnings (W) about the rotary shaft relative to the workpiece carrier wherein in each case a partial section (S') of one of the turnings (W) covering the workpiece receptacle forms one of the scanning lines; and wherein the inspection results are respectively supplied as actual values which are location-related to one of the inspection points ($P_P$), to a control and computing unit where they are assigned to stored target values which are location-related to the at least one workpiece and are compared with these and, in the event of a deviation of one of the target values from the assigned actual value, at least one process parameter is changed if the processing beam (E) subsequently impinges on the workpiece (1) at a point of incidence ($P_E$) within the relevant inspection point ($P_P$) at which the location-related actual values on which the change is based were previously obtained.

6. The method according to claim 5, wherein the inspection points ($P_P$) each have a larger extension than points of incidence ($P_E$) and a change in process parameters occurs within the same scanning cycle.

7. The method according to claim 5 wherein a change in process parameters occurs within a subsequent scanning cycle.

8. The method according to claim 5, wherein the rotational speed ($\omega$) is controlled as a function of the radial distance (r) of the point of incidence ($P_E$) of the processing beam (E) to achieve a constant exposure time of the processing beam (E) along the scanning lines.

9. The method according to claim 5, further comprising setting the ratio between the rotational speed $\omega$ and the feed rate v to set a pitch of the spiral movement path S and a distance between the scanning lines.

10. The method according to claim 5, wherein the direction of rotation ($R_{rot}$) is reversed during the scanning process.

11. The method according to claim 5, wherein the at least one workpiece is processed by more than one processing beam (E) during one revolution of the workpiece carrier.

12. The method according to claim 11, wherein the at least one workpiece is inspected by more than one inspection beam (P) during one revolution of the workpiece carrier.

13. The method according to claim 5, wherein several workpieces are processed and inspected in the same scanning cycles by positioning them on the workpiece carrier for the same processing period.

* * * * *